United States Patent [19]

Desmur

[11] Patent Number: 5,313,138
[45] Date of Patent: May 17, 1994

[54] ELECTRON GUN MODULATED BY OPTOELECTRONIC SWITCHING

[75] Inventor: Henri Desmur, Fontenay Aux Roses, France

[73] Assignee: Thomson Tubes Electroniques, Boulogne Billancourt, France

[21] Appl. No.: 774,708

[22] Filed: Oct. 9, 1991

[30] Foreign Application Priority Data

Nov. 9, 1990 [FR] France .................. 90 13938

[51] Int. Cl.⁵ .......................... H01J 23/06
[52] U.S. Cl. .................... 315/3; 315/5.33; 315/149; 313/293; 313/524
[58] Field of Search ............ 315/4, 5, 3, 5.33, 5.37, 315/149, 383; 313/302, 523, 524, 293; 331/79; 328/64

[56] References Cited

U.S. PATENT DOCUMENTS

| | | | |
|---|---|---|---|
| 4,313,072 | 1/1982 | Wilson et al. | 315/4 X |
| 4,453,108 | 6/1984 | Freeman, Jr. | 315/4 X |
| 4,703,228 | 10/1987 | West | 315/4 X |
| 4,749,906 | 6/1988 | Tran et al. | 315/4 X |
| 5,043,630 | 8/1991 | Faillon et al. | 315/5 |

FOREIGN PATENT DOCUMENTS

| | | |
|---|---|---|
| 251830 | 1/1988 | European Pat. Off. |
| 384813 | 8/1990 | European Pat. Off. |
| 60-263121 | 12/1985 | Japan |
| 63-4676 | 1/1988 | Japan |
| 307720 | 3/1981 | U.S.S.R. ............ 315/5.33 |
| 948875 | 2/1964 | United Kingdom |
| 2157846 | 10/1989 | United Kingdom |

*Primary Examiner*—Benny T. Lee
*Attorney, Agent, or Firm*—Roland Plottel

[57] ABSTRACT

An electron gun is modulated by an optoelectronic switching device. This switching device comprises a modulated light source and at least one GaAs or Si solid-state optoelectronic switch, this switch being nonconductive when not illuminated and conductive when illuminated by the modulated light source; the device also includes components to transmit the light from the source to the switch(es). In one embodiment, the modulated light source is a laser and in a second embodiment the source is a continuous source externally modulated by a mechanical or electrooptical device. The optoelectronic switching device is connected between a high-voltage source and the cathode of an electron gun, thus modulating the cathode.

The invention is particularly applicable to microwave electron tubes.

15 Claims, 5 Drawing Sheets

ELECTRON GUN MODULATED BY OPTOELECTRONIC SWITCHING

FIELD OF THE INVENTION

This invention applies to microwave electron tubes, particularly microwave tubes operating in a pulsed mode. More precisely, it applies to the electron guns used in these tubes.

The invention is particularly advantageous in obtaining very short pulses since it allows very high current modulation with very short response times. However, the invention is also applicable to other electron guns, for example those for accelerators.

DESCRIPTION OF THE PRIOR ART

Several methods of modulating the microwave energy pulses produced by an electron gun are known to industry including, in particular, modulating the cathode potential, modulation using a grid, which can be either a shadow grid or an intercepting grid, and modulation by the photoelectric effect on the surface of the cathode.

The maximum modulation frequency obtainable with conventional modulation methods by applying a high-voltage pulse to the cathode or a slightly lower-voltage pulse to a grid in front of the cathode in an electron gun, is limited by the capacitance of the components used in the modulation circuit, i.e. the cathode, the grid, the power supply conductors, etc.

In certain applications of ultra-short pulse microwave tubes, to obtain either simplified tubes or tubes with improved interaction efficiency and very high peak power, attempts have been made to inject an electron beam, already modulated into "packets" at the carrier frequency of the signal to be amplified, into the tube.

The techniques used to produced these packets of electrons are described, for example, in European patent 0 181 214, which describes a gun with a grid specially designed for this purpose, and in the applicant's French patent 2 599 565, in which the emission of packets is achieved using a photocathode illuminated by a laser whose amplitude is modulated at the carrier frequency of the signal to be amplified. This system is known as a "lasertron".

The disadvantages of modulation using a grid are well-known to industry and technical improvements have been constantly introduced over a number of years. These disadvantages mainly arise from the very high voltages generally used in small electron guns (particularly between the various electrodes) and include the heavy currents involved, high capacitance between the various components, mechanical instability due to high thermal stresses and the fragility of the assembly.

The technical problems involved in using a lasertron are less well-known since the technique is more recent but it is worth mentioning the difficulties involved in injecting the laser light into the electronic tube, the requirements applicable to the incidence of the laser light on the photocathode, etc.

SUMMARY OF THE INVENTION

This invention avoids the disadvantages of these known techniques mentioned above, which are specific to modulation by a grid or laser light. The invention proposes to modulate the electron beam from an electron gun using a new method of modulating the cathode power supply by optoelectronic devices which allow ultra-fast (a few picoseconds) switching.

In fact, ultra-fast optoelectronic switches, consisting of an optoactive semiconductor pellet placed between two conductors connected to the current source and user circuit respectively, have been in existence for a few years now.

The conduction of the device is controlled and modulated by the light density. The light has a wave length and this wave length is chosen so that the light penetrates the semiconductor pellet and renders the pellet conductive. As a non-exhaustive example, the semiconductor pellet could be gallium arsenide (GaAs) for ultra-fast switching or silicon if the switching speed required is limited to approximately a microsecond. In the case of GaAs, a 1.06 micron wavelength (in the infrared range) penetrates the material to a depth of a few millimeters; moreover, this wavelength can easily be generated by commercially-available solid-state lasers.

The depth the activation light penetrates is important since the device conducts throughout the illuminated mass and, consequently, the resistance of the optoelectronic switch, when conductive, is inversely proportional to the energy of the laser light which illuminates the pellet and to the mobility of the carriers. If, for example, a 10.6 micron wavelength is used, the penetration and, therefore, the conduction, will only be superficial. This would lead to problems due to resistance losses and local heat dissipation.

The optoelectronic switch includes an optoactive semiconductor pellet placed between two conductors. A source/drain distance of the optoelectronic switch is the distance between the two conductors.

The resistance of the photoconductor, when conductive, is proportional to the square of the source/drain distance and can be approximately 1 ohm when this distance is close to a millimeter and at illumination powers compatible with those produced by a solid-state laser source. The resistance can be even lower under avalanche conditions. The impedance of the current source, consisting of the HV power supply and the photoconductive diodes, can therefore be very low and allow fast modulation of the cathode voltage.

In addition, when in the non-conductive state, the device is capable of withstanding a voltage of several kilovolts applied to the switch terminals provided certain precautions, well-known to industry, are taken. Such a device is, therefore, capable of directly switching relatively high power. When applied, as proposed in one of the embodiments of this invention, to the modulation of a microwave tube electron gun, the advantages of fast accurate photoelectric switching are combined with the high microwave power normally obtained from electron tubes.

The invention is, therefore, an electron gun modulated by a photoelectric device as described above; the invention is also a microwave tube comprising such an electron gun modulated optoelectronically. The use of an optoelectronic switch to modulate the electron gun avoids the use of photocathodes inside lasertron-type tubes operating at high voltage and simplifies the insulation problems encountered in grid-chopped tubes.

To this end, the invention proposes a system comprising a modulated microwave electron gun in which the modulation is produced by optoelectronic switching optically controlled by control circuits, the switching devices being connected in series with the cathode high-voltage power supply, the control systems including at least one light source and devices to conduct the light between the said source(s) and the switching devices, these switching devices comprising a photoelectric semiconductor, the semiconductor being conductive when sufficiently illuminated by the optical control circuits and non-conductive when not illuminated.

The invention also consists of electron tubes including an electron gun modulated by optoelectronic switching devices complying with the invention.

BRIEF DESCRIPTION OF THE DRAWINGS

The invention will be better understood, and other advantages will become clear, upon reading the following detailed description, which is not exhaustive, and by studying the embodiment examples and the appended figures including:

The same numbers are used to identify the same components on all these figures, which are given as non-exhaustive examples of embodiments to illustrate the principles and a few applications of the invention.

In FIGS. 2, 4 and 5 the (+ −) labels represent respectively positive and negative terminals of the voltage sources.

DESCRIPTION OF PREFERRED EMBODIMENTS

Figure 1:
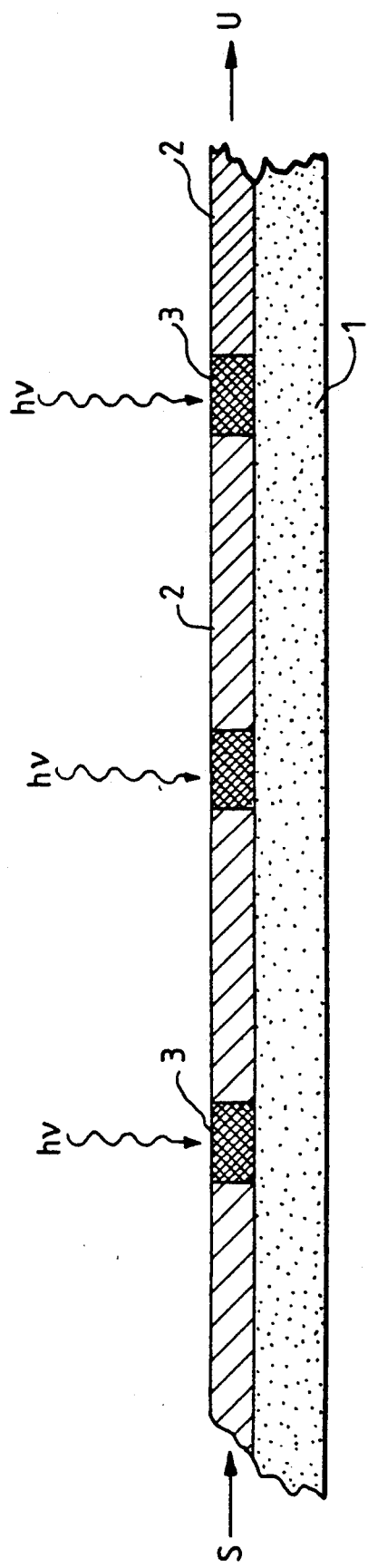
FIG. 1, which schematically represents a cross-section of an optoelectronic switching device complying with the prior art.

FIG. 1 schematically shows the simplest example of an optoelectronic switching device to illustrate the operating principle. On an insulating substrate 1, for example in alumina, conductive tracks 2 are separated by optoactive semiconductor tracks 3 placed between the conductive pellets 2 and electrically in contact with them via resistive junctions. Conductive tracks 2 could, for example, be in copper and semiconductive pellets 3 could, for example, be in GaAs or silicon or any other material possessing the optoactive properties required to achieve optoelectronic switching.

When they are not illuminated, semiconductive pellets 3 act as insulators and no current can pass from current source S to user circuit U. When illuminated by a sufficient quantity of photons, of sufficient energy level $h^*v$, an avalanche reaction makes pellets 3 conductive and current can flow between the source S and the user circuit U. This switching action can be very fast, i.e. less than a picosecond and, possibly, as short as a femtosecond. The thickness of the semiconductive pellet and the illumination wavelength are chosen such that the entire mass of the pellet becomes conductive and the switch can, therefore, carry a high instantaneous current with, for example, an instantaneous value of a few thousand Amperes. For example, if the pellet thickness is a few tenths of a millimeter and its total volume is approx one cubic millimeter, illumination by 1.06 micron wavelength light will make the pellet entirely conductive.

Laser light is perfectly suitable to provide photons of the required wavelength and, moreover, lasers can easily be modulated over a very wide range of frequencies and are, therefore, ideal sources of photons for an electron gun modulator. However, in another embodiment of the invention, the light can originate from a continuous source, such as a gas-filled lamp, this light source being modulated by a mechanical shutter or an electro-optical device such as, for example, a Pockels cell.

Any convenient or conventional light beam modulation may be used. It is well known how to modulate a light beam with mechanical devices. These mechanical devices can be a shutter which might be, for example, a rotating disk with light passing through portions and light blocking portions; see for example, U.S. Pat. No. 4,432,511. This patent describes a laser beam modulated by a rotating disk (see col. 1, lines 27–30 and lines 43–68). It is also well known how to modulate a light beam with electro-optical devices such as Pockels cells or Kerr cells. See for example an excerpt of readings from *Scientific American: Lasers and Light*, Chapter 30, "The Modulation of Laser Light," pages 332–333. Also see U.S. Pat. No. 5,043,630 which shows a Pockels cell for modulating a light beam.

Figure 2:
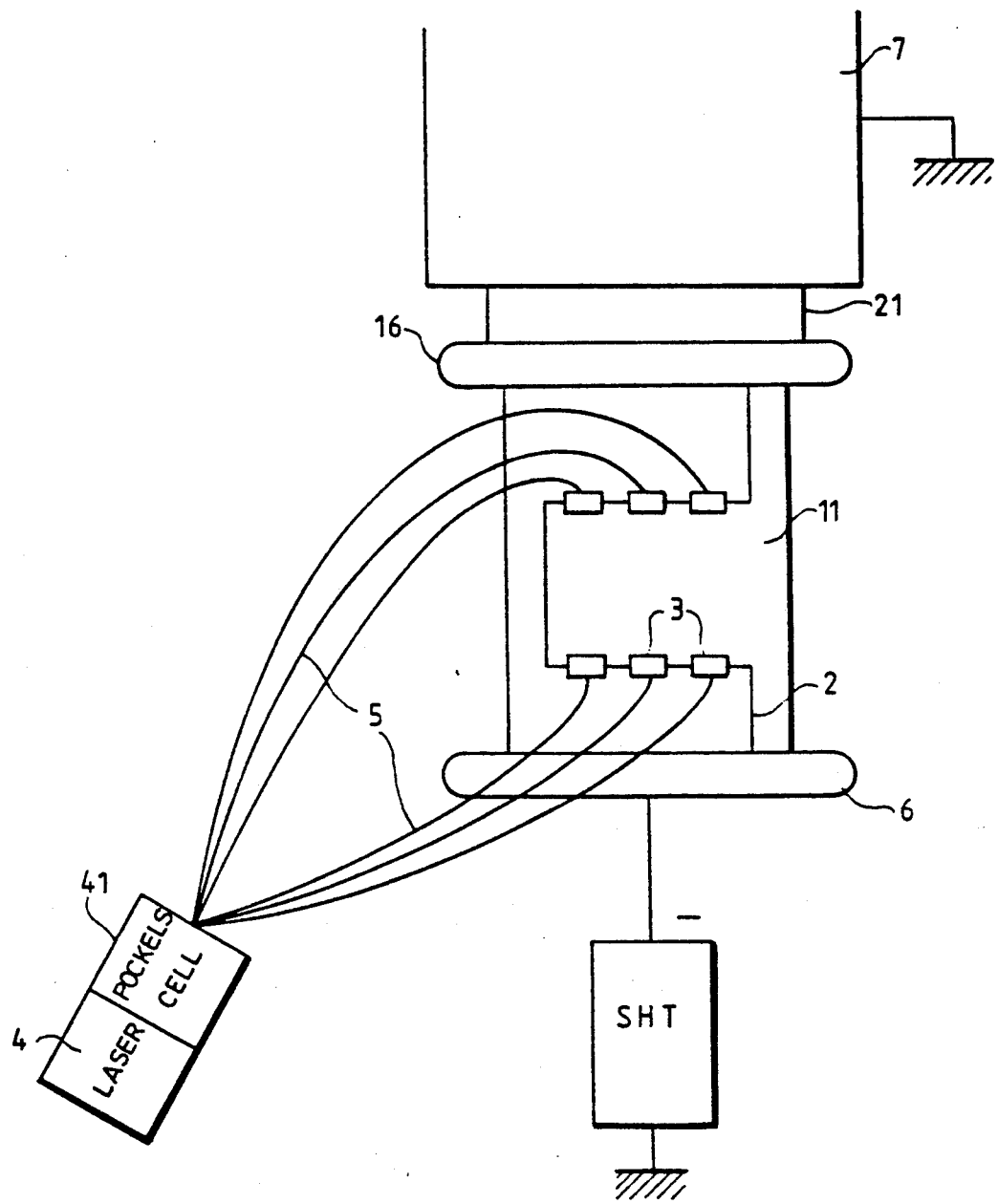
FIG. 2, which schematically represents a plan view of an electronic gun modulated by optoelectronic switching complying with the invention.

FIG. 2 schematically illustrates a detail of one example of an electron tube whose electron gun is modulated by optoelectronic switching complying with the invention. It shows several optoelectronic switches 3 on a conductive track 2 placed between two conductive rings 6 and 16. These rings 6 and 16 are brazed respectively to each end of an insulating cylinder 11 in, for example, alumina, using methods well known to industry. Another insulating cylinder 21 is brazed to ring 16 at one end and to the conductive tube body or collector 7, connected to ground, at the other end. This conductive body 7, connected to ground, also collects the electrons output by the electron gun. A source of high voltage SHT is electrically connected to ring 6 and the user circuit is electrically connected to ring 16; this second connection is inside the tube and therefore not shown on this drawing.

Optoelectronic switches 3 are controlled by laser light generated by laser source 4 and applied to the switches by optical fibers 5. This illustration of an embodiment of the invention shows the photons produced by a YAG laser but the light source could equally well be a solid-state laser; in this case, it would be possible to use several laser sources which could be close to, or even bonded on, switches 3 themselves and there would then be no need for the optical fibers to transmit the light energy. As mentioned previously, other light sources could also be used. The light of the laser source 4 is modulated by a Pockels cell 41 inserted between the laser 4 and the optical fibers 5.

As in FIG. 1, when laser source 4 applies light to optoelectronic switches 3, the switches become conductive and current can flow from the high-voltage source SHT to the user circuit (not shown) which, in this example, would be the cathode of an electron gun.

This example shows several switches 3 connected in series between the high voltage source SHT and the user circuit (not shown) since each switch will withstand several kilovolts across its terminals when nonconductive and in this example of an embodiment, the cathode is assumed to operate at a voltage of several tens of kilovolts; consequently, perfect isolation can easily be obtained by a sufficient number of switches in series. The light modulation and transmission system, represented by laser 4 and optical fibers 5 in this figure, is designed to apply sufficient light energy to all switches at the same time so that all become conductive simultaneously and none is required to withstand more than a few kilovolts across its terminals.

Figure 3:
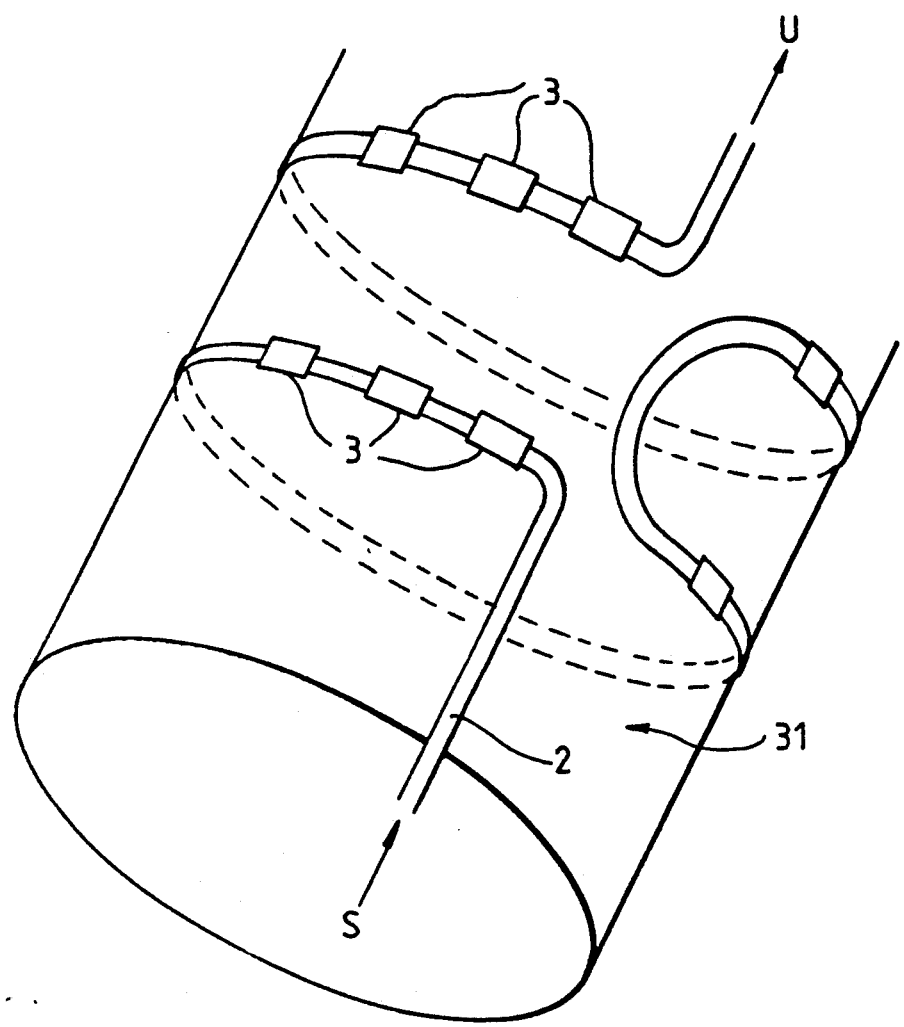
FIG. 3, which is a schematic perspective of a special arrangement of optoelectronic switches in an electron gun modulation device complying with the invention which reduces inductance during conductance of the current.

FIG. 3 schematically illustrates a special arrangement of optoelectronic switches 3 which are connected in series on a conductive track 2 that makes almost two complete turns around the surface of insulating cylinder 31. To eliminate the self-inductance due to the high current between current source S and the user circuit U, the conductive tape makes one complete clockwise turn around the cylinder and then a second turn in the opposite direction. Because the current is the same through both turns, the magnetic field generated by one turn is equal in amplitude but opposite in direction to the field created by the other turn. The total self-inductance is therefore minimized. Other arrangements, based on the same principle, could easily be produced with an even number of turns, half in one direction and the other half in the other direction.

Figure 4:
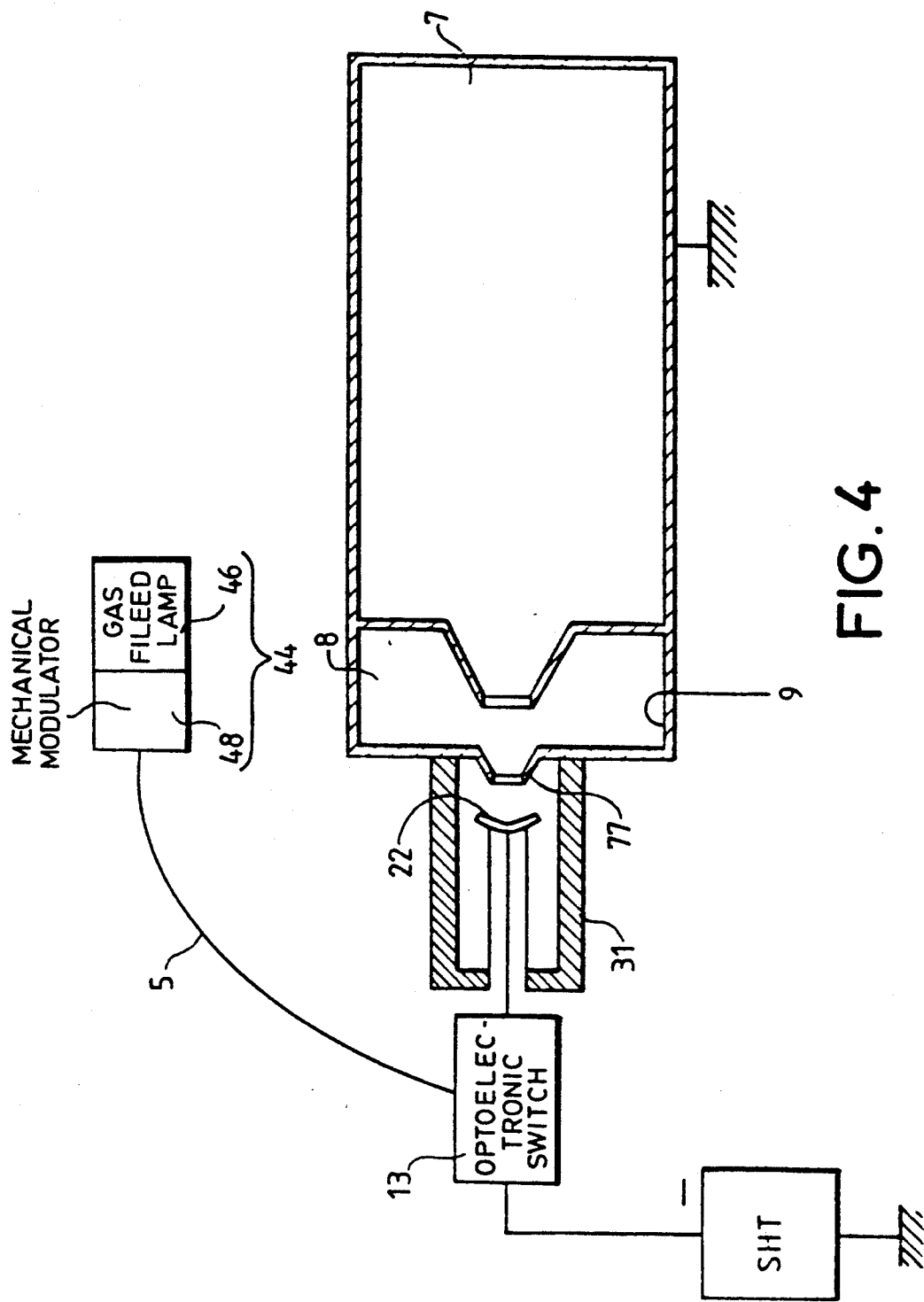
FIG. 4, which is a schematic longitudinal cross-section of an example of an electron tube including an electron gun modulated by optoelectronic switching complying with the invention.

FIG. 4 is a schematic cross-section of an example of an electron tube embodying an electron gun complying with the invention. It shows a modulated light source 44 having a gas filled lamp 46 and a mechanical modulator 48. The modulated light feeds through optical fibers 5, to optoelectronic switching device 13 which controls the current output by high-voltage source SHT to modulate cathode 22. No details of the optoelectronic switching device 13 are shown but this could take any of the forms described previously or other forms easily conceived by industry based on this description of the invention principles.

The electrons ejected from the surface of cathode 22 when a high-voltage negative pulse, generated by high-voltage source SHT and modulated by the optoelectronic modulation device 13 is applied to it, are accelerated towards the tip of anode 77 which is connected to ground, thus creating a modulated electron beam which passes through resonant cavity 8 and then impinges on the internal faces of collector 7. As it passes through the resonant cavity, the highly modulated electron beam generates intense microwave fields within the cavity; part of the microwave energy can be tapped by coupling loop 9 and fed to a user circuit (not illustrated). Consequently, this device acts as a microwave amplifier and amplifies the modulation signal output by light source 4.

Figure 5:
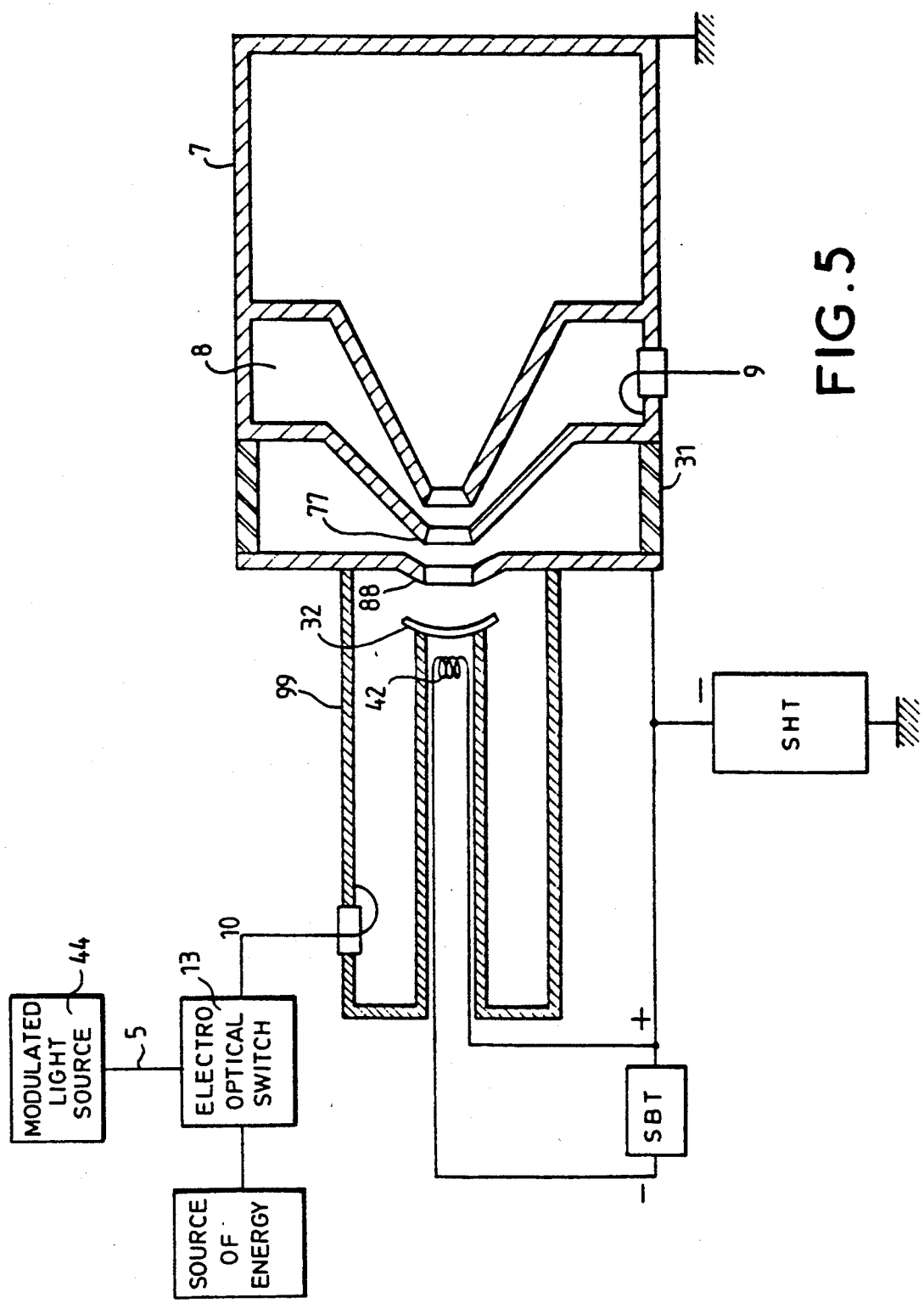
FIG. 5, which is a schematic longitudinal cross-section of another example of an electron tube including an electron gun modulated by optoelectronic switching complying with the invention.

FIG. 5 schematically shows another example of the use of an electron gun modulated by an optoelectronic switching device complying with the invention. In this example, cathode 32 is heated by filament 42 fed by a low voltage source SBT while high-voltage source SHT raises the high-voltage assembly 99, which includes cathode 32 and Wehnelt 88, to high voltage. A Wehnelt is an electron beam forming electrode maintained generally at the same voltage as the cathode. The modulation generated by the optoelectronic modulation device 44 is applied to coupling loop 10, creating a microwave field in the space around the cathode. This fluctuating field draws electrons from the hot cathode surface, creating electron packets which are then accelerated towards the tips of anode 77, which is connected to ground. Insulating cylinder 31 separates the high-voltage components from the components connected to ground. The accelerated electron packets form a highly modulated electron beam which passes through resonant cavity 8 before impinging on the internal faces of collector 7. The microwave energy from the electromagnetic fields thus created in resonating cavity 8 can be tapped and fed to a user circuit via coupling loop 9.

What is claimed is:

1. A microwave tube electron gun comprising a means for supplying high voltage (SHT); a cathode (22); an optoelectronic switch (13) connected between said supply means and said cathode; and means operatively coupled to and for optically activating said optoelectronic switch (4, 5) with modulated light, said optoelectronic switch having a switching speed faster than a microsecond; whereby said cathode generates a modulated electron beam which is modulated in accordance with voltage modulation provided by said optoelectronic switch supplied to said cathode, said voltage modulation provided by said optoelectronic switch being responsive to the modulated light from said optically activating means.

2. An electron gun according to claim 1 wherein said optoelectronic switch comprises a coil shaped track disposed on an insulating cylinder (31) between a connection (6) of said supply means and a connection (16) of said cathode, said coil shaped track having turns oriented in a first direction and then oriented in a direction opposite to the first direction, whereby a self-inductance in said gun due to current flow through said track is reduced.

3. A microwave tube electron gun comprising cathode means for generating an electron beam; an optoelectronic modulation means comprising in series a voltage source, an optoactive switch having alternative conductive and insulating states and an output; said optoelectronic modulating means further comprising a series connection of a light source of predetermined frequency to control said optoactive switch; means for modulating said light from said source, means for permitting transmission of said modulated light to said optoactive switch; and means for coupling said output of said optoelectronic modulation means to said cathode for modulating said electron beam.

4. An electron gun generating a modulated electron beam at a predetermined frequency comprising, a cathode for emitting electrons of the beam toward an electrode; an energy source for generating an electric field in a space including the cathode and the electrode in order to extract the electrons from the cathode, said energy source being coupled to the cathode through an optoelectronic switch having alternate conductive and insulating states; means for modulating the electron beam comprising at least a modulated light source operated at the predetermined frequency for modulating said optoelectronic switch, said modulated light source being connected to said optoelectronic switch so that, in response to the modulation imparted on the optoelectronic switch, optoelectronically switching between the conductive and insulating states, and thus the electric field in the space is correspondingly modulated to effect the modulated electron beam.

5. An electron gun according to claim 4, wherein the energy source is a high voltage source, and the optoelectronic switch is connected between the high voltage source and the cathode.

6. An electron gun according to claim 4, wherein the optoelectronic switch is connected between the energy source and a coupling loop penetrating into the space, said coupling loop in response to the energy source generating the electric field and also generating a magnetic field in the space.

7. An electron gun according to claim 4 or 5 or 6, wherein the light source is a gas-filled lamp.

8. An electron gun according to any of claims 4 or 5 or 6, wherein the light source is a laser.

9. An electron gun according to claim 4, wherein the light source is modulated by an electrooptical device.

10. An electron gun according to claim 9, wherein the electrooptical device includes a Pockels cell.

11. An electron gun according to claim 4, wherein the optoelectronic switch is a gallium arsenide switch.

12. An electron gun according to claim 4, wherein the optoelectronic switch is a silicon switch.

13. An electron gun according to claim 4 wherein modulated light from the modulated light source is guided to the optoelectronic switch by at least an optical fiber coupled therebetween.

14. An electron gun according to claim 4, wherein the optoelectronic switch comprises a plurality of optoelectronic switching elements connected in series between the energy source and the cathode, and all of said elements being controlled by a single modulated light source.

15. An electron gun according to claim 4, wherein the light source is modulated by a mechanical device.

* * * * *